United States Patent
Semff

[11] Patent Number: 6,063,327
[45] Date of Patent: *May 16, 2000

[54] METHOD FOR MAKING HIGH YIELD-LOW CARBON CERAMIC VIA POLYSILAZANE

[75] Inventor: Louis Richard Semff, Flower Mound, Tex.

[73] Assignee: Raytheon Company, Lexington, Mass.

[ * ] Notice: This patent issued on a continued prosecution application filed under 37 CFR 1.53(d), and is subject to the twenty year patent term provisions of 35 U.S.C. 154(a)(2).

[21] Appl. No.: 08/986,596

[22] Filed: Dec. 8, 1997

Related U.S. Application Data

[60] Provisional application No. 60/033,666, Dec. 18, 1996.

[51] Int. Cl.$^7$ .................................................. C04B 33/32
[52] U.S. Cl. .......................................... 264/624; 264/626
[58] Field of Search ..................................... 264/624, 626

[56] References Cited

U.S. PATENT DOCUMENTS

| | | | |
|---|---|---|---|
| 3,422,057 | 1/1969 | Schmidt | 260/41 |
| 5,167,881 | 12/1992 | Atwell et al. | |
| 5,176,941 | 1/1993 | Peuckert et al. | 427/226 |
| 5,190,709 | 3/1993 | Lukacs, III . | |
| 5,268,336 | 12/1993 | Deleeuw et al. | |
| 5,632,925 | 5/1997 | Moulton et al. | |
| 5,707,471 | 1/1998 | Petrak et al. | 156/89 |
| 5,738,750 | 4/1998 | Purinton et al. | 156/325 |
| 5,738,818 | 4/1998 | Atmur et al. | 264/624 |

FOREIGN PATENT DOCUMENTS

| | | |
|---|---|---|
| 0372381A2 | 6/1990 | European Pat. Off. . |
| 0623571A1 | 11/1994 | European Pat. Off. . |
| 4016052A1 | 11/1991 | Germany . |

*Primary Examiner*—Christopher A. Fiorilla
*Attorney, Agent, or Firm*—Baker Botts L.L.P.

[57] ABSTRACT

A method of making a shaped article and composite therefor which includes of a shaped tool, such as a mold and providing a composite of a quartz fabric disposed within a polysilazane which is moldable at a temperature below the curing temperature of the polysilazane and cured by catalyst. The polysilazane can be optionally filled with particulate material. A compaction pressure is applied to the composite to insure contact of the composite and the tool and prevent loss of less reactive polysilazane components. The composite is then cured to hardness by increasing the temperature applied to the composite at a rate of about 10° C./minute to a temperature of about 150° C. and holding that temperature of about 150° C. up to about 4 hours to provide a cured polymer. The cured composite is removed from the tool. The polymer can then be converted to a preceramic by heating the cured polymer to a temperature sufficiently high in an inert atmosphere or ammonia gas for a sufficient time. The removal of carbon will occur when processed in ammonia The preceramic can then be reprocessed by repeating the above procedure after cooling and reinfiltrating with uncured resin.

10 Claims, 1 Drawing Sheet

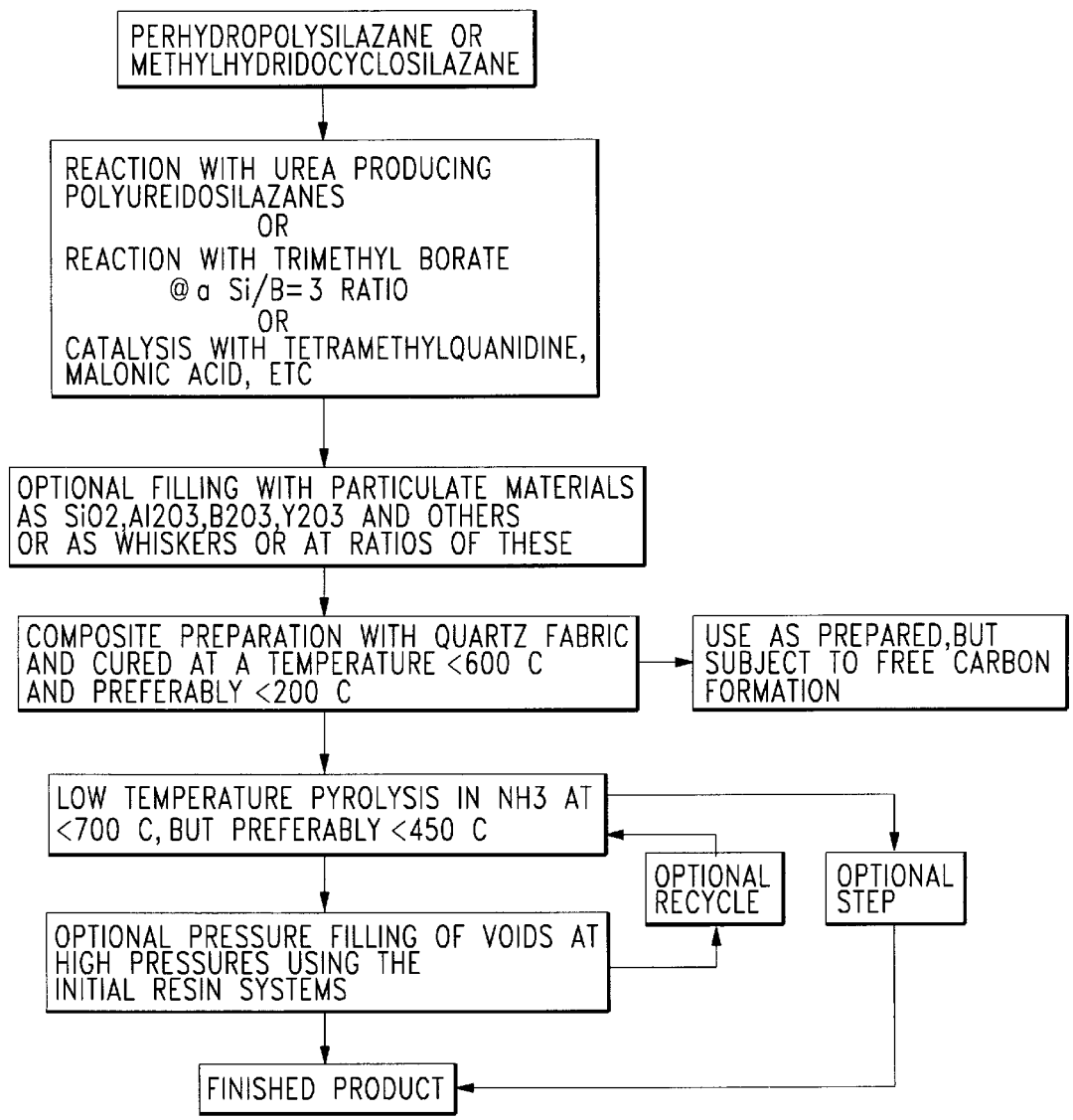

METHOD FOR MAKING HIGH YIELD-LOW CARBON CERAMIC VIA POLYSILAZANE

CROSS REFERENCE TO RELATED APPLICATIONS

This application claims priority under 35 USC §119 of provisional application number 60/033,666 filed Dec. 18, 1996.

BACKGROUND OF THE INVENTION

1. Field of the Invention

This invention relates to a method for converting inorganic polysilazanes, into useful preceramic and ceramic materials having very little or no available carbon for use in conjunction with the fabrication of electronic circuit boards, electronic device coatings, broad band radomes and the like. Additionally, the process proceeds at low temperature conditions, thereby allowing long term high temperature sensitive materials, such as ultra pure fused quartz fiber, to be used in composite fabrication.

2. Brief Description of the Prior Art

Electronic circuit boards, electric device coatings, broad band radomes and the like require low dielectric and low dissipation properties in order to minimize the loss of microwave energy due to heating. Broadband radomes, in addition, must be capable of working throughout large regions of the microwave spectrum. Typically, prior thermal requirements for such devices have been satisfied using a composite of high performance organic polymers in conjunction with fused quartz fabric for radomes. The properties required from the fabric are that it have good structural integrity and be transparent for microwave transmission, ultra pure fused quartz being the preferred such material since it has the best combination of the desirable properties.

The requirements for the next generation of radomes are very stringent for short term, very high temperature exposures, such requirements including the ability to sustain temperatures as high as 1600° F. (870° C.) for 5 minutes and 2300° F. (1260° C.) for a few seconds without significant deterioration. These conditions substantially exceed the capability of the prior art of organic polymers. The organic polymers are readily consumed by pyrolysis and oxidation destruction at these temperatures. As a result, inorganic materials must be used as the materials of choice. However, fused quartz fabric, which must be used in the composite to insure meeting the electrical requirements, cannot be subjected to the high temperatures required in the processing of typical inorganic ceramic systems, these temperatures generally being in excess of 1000° C. for a period of hours. Exposure of quartz to temperatures of 1000° C. for one hour have resulted in a reduction to 25% of the original tensile strength. Damage to the quartz has been encountered at temperatures as low as 750° C. over a longer period of time.

A solution by this invention to the above described problem for these new radome requirements relates to the use of high temperature-enduring inorganic polymer systems for radome fabrication. By using organo-inorganic polymers (precursors), such as, for example, perhydropolysilazane and low carbon containing polysilazanes such as methylhydridocyclosilazane, or a mixture of these, processing can be conducted at lower temperatures such as 700° C. and below to achieve a near ceramic state material. The use of these near ceramic state materials in higa velocity radomes, for example, would result in further conversion of the material to a ceramic material during the high temperature trajectory, but this high temperature condition would be experienced over a very short period of time, thereby resulting in no quartz damage. While inorganic polymers can resolve the high processing temperature causing damage to quartz, the fabric material of choice, they introduce new difficulties which are resolved in accordance with the present invention.

One of these difficulties is that most inorganic polymers have organic components within their system. Upon processing to temperatures of 400° C. and above, the organic components in many cases decompose to some free elemental carbon. This carbon is very damaging to the electrical properties of the final ceramic material.

Additionally, the inorganic polymer conversion from polymer to ceramic is generally defined as a low yield conversion. Yield is defined as the ratio of the weight of final material to the original polymer. Due to the low yield, a significant volumetric conversion occurs, resulting in matrix cracks, voids and pull away from any fibrous material which may be in the composite. The net effect is a reduction in structural properties. This reduction in structural properties requires numerous reinfiltrations to add replacement material to the depleted areas. This then requires a repeat of the high temperature process steps to densify the composite. This repeated processing is very damaging to the quartz used to accomplish the ideal electrical properties. This problem is addressed by the present invention by increasing the molecular weight and crosslinking of the polymer with additional changes such as the addition of a high pressure compaction processing step and the addition of resin fillers.

It is apparent that the below described new processing steps are required in order to meet the specifications for the new class of radomes and the like.

SUMMARY OF THE INVENTION

The present invention provides a solution to the numerous concerns identified above which are inherent in the prior art. In accordance with the present invention, the polymer precursors chosen are compounds which are either free or virtually free of organic (carbon-containing) radicals, thereby reducing or eliminating the potential for free elemental carbon formation during processing. The maximum amount of acceptable free carbon is about 0.5% by weight of the ceramic material, and this requirement is especially significant at elevated temperatures. Additionally, those preferred organic radical loaded inorganic polymers do not include the carbon-rich inducing organic components such as phenyl groups, triple bonds or possibly even double bond groups. Polymers or precursors that can be used are preferably perhydropolysilazane or alkylhydridocyclosilazanes having preferably hydrogen and/or methyl groups attached thereto (this being perhydropolysilazane when all of the groupings are hydrogen), these polymers having numerous, preferably up to 12 cyclic silazane units. All of the acceptable materials having organic carbon components require the capability to remove the carbon based organic radicals and replace them with nitrogen-based components through the process of ammonialysis which is described herein below.

The unfortunate reality with the likely precursors that would appear to be useful to provide the desired result described above is that such precursors process typically to low molecular weight polymers. The primary result of using the low molecular weight polymers includes thermal breakdown during processing to lower molecular components and high outgassing of gaseous products, such as hydrogen. Due to the loss of these components, a low ceramic yield occurs which results in shrinkage, cracks and voids due to the volumetric changes. The low ceramic yield which occurs is defined as the percentage of ceramic material resulting from the original polymer. Because of these factors, many reinfiltrations are required, resulting in numerous heating and cooling cycles for the quartz fiber.

To correct these problems, the selected polymers must be converted to materials of higher molecular weight that are branched or highly cross-linked. This will reduce the susceptibility of thermal pyrolysis to lower molecular weight volatile components, but instead increase the conversion to a high yield of ceramic materials. Also, the molecular weight midst be such that the polymer is moldable at a temperature which is sufficiently low so as not to cause curing of the polymer before conforming to the shape required.

Conversion of the polymer to higher molecular weight material is accomplished in accordance with the present invention by numerous methods before utilizing the Precursor for radome fabrication applications.

Literature has demonstrated the high activity of the Si—N and N—H bonds in silazanes. This fact of organcsilicon chemistry can be utilized in the conversion of cyclos-lazanes into useful materials of higher molecular weight.

Among the methods for improving molecular weight and crosslinking for polysilazanes are by reaction with urea, forming polyureidosilazanes. The minor add-on carbon content from the urea does not represent a significant factor since much of the carbon is lost from gaseous evolution during ceramic processing.

Additional studies have shown the utilization of the N—H bond to increase molecular weight and crosslinking by using catalysts, such as, preferably, tetramethylguanidine or malonic acid. The use of tetramethylguanidine to catalyze the polymerization of methylhydridocyclosilazane results in a yield of about 83 percent which is very acceptable.

Substantial ceramic yield increases occur from these efforts, allowing one step infiltration and an alleviation of the shrinkage and cracking inherent in the prior art.

Also, the polymer can be optionally filled with inert particulate material to reduce the problem of shrinkage and cracking. A filler content of up to 70 percent by volume is feasible. The purpose of this filler is to act as a non-shrinking body during the process of thermally curing the selected inorganic precursor material (matrix). Also, this filler material can be selected to extend the desirable electrical qualities of the quartz fabric used with the matrix to fabricate the composite. Additionally, the inclusion of a large amount of filler material helps to reduce the quantity of polymer required, thereby reducing many of the difficulties encountered as a result of their processing. The preferred particulate material is ultra pure fused silicon dioxide ($SiO_2$) due to its good Electrical properties, though aluminum oxide ($Al_2O_3$), boron oxide ($B_2O_3$) and yttrium oxide ($Y_2O_3$) or any other materials that can contribute to the issues of shrinkage during processing or high temperature trajectories and maintain good electrical properties. Any combination of these materials may also be advantageous. The boron oxide ($B_2O_3$) would act as a flux binder at the high temperatures experienced during processing or the trajectory. Yttrium oxice ($Y_2O_3$) can present a material with good electrical properties, although not as ideal as silicon dioxide ($SiO_2$). The filler can be in the form of particles, fibers, whiskers or any other geometric shape.

The optionally filled highly cross-linked polymer is then combined with a quartz fabric wherein the cross-linked polymer fills the interstices of and also coats the fabric to form a composite. This composite is then heated to a temperature below about 600° C. and preferably in the range of from about 150° C. to about 200° C. to cure the polymer. It should be understood that the curing is a function of time and temperature, so a temperature even below 150° C. can be used, however the curing time will then be longer. The lowest cure temperature is desirable since evolution of gases is then more easily controlled. Vigorous evolution of gas would cause excessive composite porosity. A compaction pressure of up to 500 psi, but not limited to this pressure, is optionally desirable since it assists in preventing the loss of volatile resin components and maintains a low void cured resin matrix.

All of the acceptable mentioned inorganic polymers which contain carbon-based radicals upon high temperature stress of about 400° C. and greater are susceptible to releasing free elemental carbon. Only polymers such as perhydropolysilazane are not susceptible since they are totally free of carbon. The release of free elemental carbon results in a significant deterioration of the composite's electrical properties.

To alleviate the potential of releasing carbon from the polymer during high temperature applications, such as high temperature trajectories, it is necessary for the polymer to be processed in a heated environment of ammonia gas defined herein as ammonialysis. In this step, the organic radicals are expelled and replaced by radicals of nitrogen components. For example, the organic components may be methyl radicals which would be removed as the volatile gas methane and replaced as a nitrogen based group. The ammonialysis step takes place at a temperature below 700° C. and preferably in the range of about 400° C. to about 600° C. This temperature range represents a temperature which results in minimal damage to the quartz fiber portion of the composite. For composites of less than 1 centimeter in thickness, the process requires less than 5 hours, but is not limited to this time. Heating of these transformed precursors, for example, in a high temperature trajectory will ultimately result in conversion to silicon nitride. This is a material of acceptable electrical properties.

While the amount of permissible free elemental carbon cannot be accurately defined, it appears that a value greater than about 0.5 percent by weight of free elemental carbon is undesirable, especially at elevated temperatures. Free carbon is defined as carbon not chemically bonded to any other elements. The percent of free elemental carbon is a weight percent based upon that portion of carbon compared to the final ceramic.

Lower members of the alkyl group are the most desirable candidates for ammonialysis since the case for exchange is easiest. Double bond radicals such as the vinyl group are less desirable. Triple bond groups are even less desirable. Aromatic groups such as phenyl are yet less acceptable. Ammonialysis can be successful with the above more difficult groups, however, the effort presents longer processing times and can require higher temperatures. Both of these factors are undesirable for quartz durability. A processing temperature less than 500° C. and a precursor having carbon present only in methyl groups is ideal in that the least damage is experienced by the quartz and the most thorough removal of the organic components is experienced.

During the high processing temperature exposure to ammonia, the polymer makes a transition to a near ceramic material. Further movement toward a ceramic occurs during the high temperature trajectory in the case of a radome to which parts fabricated from this polymer are subjected during actual use. Due to the short trajectory exposure, no damage to the quartz occurs, thereby resulting in no degradation to the electrical or mechanical properties.

The essentially carbon-free near ceramic composite, which has some cracks and voids due to gas evolution and process curing, is then optionally pressure reinfiltrated with the initial resin system at high compression pressures. Since all of the precursors when processed evolve volatile byproducts, there is a resultant composite material which has a certain decree of porosity, even when utilizing the compaction pressures exercised in the early stages of this overall process. The porosity is composed of very minute openings and cracks in the primary body and annular openings around the fibers. The standard manner of filling these openings is by using surface tension forces to draw the resin into the openings, however this is not a thorough method for having complete filling. Additionally, air is present and this resists complete filling. In this process, filling is complete since it is performed after a vacuum of greater than 29.6 mm of Hg is applied followed by forcing the resin into every opening by high compression pressures of up to about 2000 psi, but not limited to this pressure. The added resin can then be processed as was the case in the original composite to provide the finished composite for use in fabrication of radomes, printed circuit boards and the like.

BRIEF DESCRIPTION OF THE DRAWING

The FIGURE is a process flow in accordance with the present invention.

DESCRIPTION OF THE PREFERRED EMBODIMENTS

Two general polysilazane groups that are ideally suited for use in accordance with the present invention are perhydropolysilazanes and alkylhydridocyclosilazanes, the methyl form thereof being preferred. In each case, these materials are ideal in that they are free of any carbon laden groups or have carbon laden groups which by later described processes can be removed. This capability of carbon removal is necessary since the presence of free elemental carbon results in significantly reduced electrical properties critical for application for which it is intended. Free elemental carbon is a product from methylhydridocyclosilazane as a result of later high temperature processing steps or as a result of high temperature applications. Typically, these silazane types are derived by the ammonialysis of halogenated silanes.

The alkylhydridocyclosilazanes of particular interest represent a reaction of ammonia with a dichloroalkylsilane. Other halogenated alkyl silanes such as monochloro- and trichlorosilanes can be used to prepare various silazanes, however, the preferred processed preceramic materials are derived from the dihalogenated alkylsilanes. Since the removal of carbon is a critical item in the application of this invention, it is necessary that any attached organic groups be easily removed. The preferred alkyl member for achieving this removal of carbon is the shortest chained member which is the methyl group. Other members, such as ethyl, propyl, etc. become more difficult and more susceptible to thermal decomposition during the high temperature processing steps which result in significant free carbon formation.

The general descripton of these cyclic materials is $(RSiHNH)_x$ or $(RSiN)_y$. The R is $CH_3$ for a methylhydridocyclosilazane or hydrogen if the general formula is for perhydropolysilazane. A typical oligomer of methylhydridocyclosilazane may contain a mixture of 30 to 40% of the x component ard 55 to 65% of the y component. Molecular weights of less than 2000 are typical, however this is undesirably low. Due to the fact that these resin systems generally have a low molecular weight and limited crosslinking when subjected to later processing at elevated temperatures, these oligomers will tend to break up into smaller molecular units, resulting in poor yield for the final ceramic. Yield in this case being the weight of final ceramic to the weight of the initial cyclic silazane.

Recognizing the need to improve the resin to ceramic yield lead to research into methods of increasing the molecular weight and crosslinking. An initial success was demonstrated by Brewer and Haber in J. Amer. Chem Soc., 1948. In this effort, a cyclosilazane was reacted with potassium hydride and a follow up with methyl iodide to produce a nonvolatile, white solid which was a highly crosslinked material. The yield on this material less than 80%.

A later improved and simpler method to accomplish an equivalent goal was to react urea with a cyclic silazane which resulted in the material polyureidosilazane. Various ratios of urea to the cyclic silazane can be reacted. At a ratio of 10:1 the product is a liquid cyclic material. However, if the ratio is reduced to 5:1 the product is a gum. By going to a 2:1 ratio, the material becomes a white solid. In all cases, the molecular weight is improving and crosslinking is becoming more evident.

While all of the above described approaches are feasible for application to the present invention, the preferred method is the reaction of the chosen cyclosilazanes with catalytic agents. The chosen catalyst for this effort is tetramethylquinidine. A 2.5 molar % application based upon the silicon of the above formula is effective in polymerizing the resin. A reaction temperature of 150° C. results in curing the resin in a 3 hour period, but curing is not limited to this time or temperature. The reaction will proceed at lower temperatures, but at a slower rate. Higher termperatures result in more active outgassing, making the process less controllable. Since these materials have relatively low molecular weights, even with the presented methods, there still is some tendency to break down further to lower molecular units due to the thermal stress of curing. These break down materials will have a tendency to be less vigorous to polymerize than the primary bulk of material during the curing process. As they are subjected to heating, they will easily vaporize and not polymerize. The net effect is loss of material and a resulting low yield. To eliminate this loss, the resin must be contained to prevent its loss by subjecting the reacting material to an environmental pressure exceeding the vapor pressure of the reactants and products of reaction (not including hydrogen or methane that may evolve) while being heated to stimulated polymerization. A great portion of the lesser reactive more volatile components will polymerize, thereby insuring higher yields. An inert environmental gas pressure of 250 psi, but not limited to this pressure can be used successfully with a processing temperature of 150° C. Gases ideal for this application are dry nitrogen, argon and other gases inert to the reaction. Dry conditions are necessary when processing cyclic silazanes, since these materials are susceptible to moisture attack and oxidation if air is present.

When processing these materials, shrinkage becomes an issue, partiuclarly in efforts to process tolerance controlled parts. Shrinkage results from the loss of mass, but this loss also causes an increase in density, cracking and a matrix volumetric reduction. Volumetric reduction begins immediately on curing since there is an evolution of gas such as hydrogen and some alkyl components. Additionally, if sufficiently high molecular weight improvements and crosslinking have not been made, there is a tendency for chemical breakdown of components into low molecular weight units to occur. Processing to higher temperatures than 150° C. can result in the evolution of the above materials.

Curing to 150° C. only yields a cured polymer material. Additional heating to higher temperatures is critical to yield preceramic materials. A temperature processing cycle to 700° C. results in a cured preceramic. Upon heating to these temperatures, a weight loss is experienced due to the evolution of hydrogen, methane and other products when processing methylhydridocyclosilazane. It is during the processing from 150° C. to 700° C. that shrinkage is experienced since the composite becomes hardened and any loss of material from the polymer at this condition results in volumetric reduction followed by some cracking.

Addressing shrinkage is accomplished bad two approaches. The resin can be diluted by use of fillers such as silicon dioxide, aluminum oxide, other ceramics, silicon nitride, partially pyrolyzed polysilazanes, etc. These are some likely candidates but are by no means limited to this list. Likewise, a mixture of any of these can be used to achieve a special ourpose. The desired material is ultrapure fused silicon dioxide, since the material will not only improve resistance to shrinkage, but will improve the electrical properties. The filler material can be in any of many physical shapes, such as fibers, particles, whiskers, etc. The chosen material performs its function best if distributed thoroughly into the resin fiber composite. Filler sizes and diameters are selected on the basis of the final goals to be achieved for the composite.

In each case, these materials will assist the final product in dealing with shrinkage due to the fact that these materials represent non-shrinkage media during the processing steps. The net effect is that the polysilazane shrinkage is reduced. Additionally, the extent of bubbles due to the evolution of gases is reduced because the portion of resin to fabric in the composite is reduced. Also, the filler material represents a pathway for formed gases to travel from the composite.

Additionally, to assist in the reduction of the void problem resulting from the evolution of product gases and potential loss of low molecular less reactive components resulting from the breakdown of the higher molecular weight materials, an additional step in processing is essential. This is the application of a high pressure compression or compaction environment which does not allow large void formation during the resinous stage and restricts the evolution of less active low molecular weight components. By using compressive environment pressures of 300 psi or greater, these components are contained and are assisted to polymerization. Compressive pressures of 1500 psi are ideal in processing composites free of voids and assuring complete processing of all materials. The compressive pressures are not limited to these values, but are determined on the basis of the particular polymer being used and the processing temperature conditions.

When processing these components, it is also important to insure a high fiber to resin final ratio. This is accomplished by using the previously described compaction forces, insuring maximum densification of the composite. A final resin (or preceramic) volume percent of 40 to 50 percent is desirable. The preferred ratio is 45 percent. Utilizing this ratio insures that sufficient resin is present so that all regions between the fibers are filled, not allowing the presence of voids.

The perhydropdlysilazanes do not have any undesirable carbon present in their chemical makeup, however, the alkylhydridocyclosilazanes do have a potential problem to yield free elemental carbon during processing. The potential problem-causing carbon is eliminated by a process known as ammonialysis. This activity occurs at temperatures sufficiently low such that no damage will occur to the quartz fabric. It is imperative that quartz fabric be used in order to insure the low dielectric and loss tangent electrical properties. It is also imperative that processing temperatures for the composite not exceed 800° C. due to the potential damage of the quartz fabric. The ammonialysis step is performed ideally to composite material that has been previously processed in an inert environment and temperatures up to the general area of 500° C. and at compaction pressures up to 1500 psi and possibly higher. Polymer material that has experienced this extent of processing has passed a primary region in which an extensive amount of byproducts have evolved from the polymer. The ammonialysis step is ideally performed in the 400 to 600° C. range. In this step, the cured composite material is heated in an environment of ammonia gas for a period of hours. At the low end of the temperature range, a longer period of time is required whereas at the higher temperature region a shorter period of time is required. In either case, the temperature and time conditions are such that no damage results to the quartz fabric. As a result, the structural properties of the composite material at an equivalent conditions basis will not be reduced and favorable electrical properties are maintained.

During the ammonialysis step, some shrinkage of the composite can occur. This results in a reduction of the structural properties of the composite. Rejuvenation of the structural values occurs if the various cracks and voids resulting from the prior processing steps are refilled by the initial primary resin/catalyst system and processed to hardness. Due to the very minute sizes of the crack and voids, it is imperative that refilling occur from high pressure infiltration using pressures up to and possibly in excess of 1500 psi. Curing is performed as previously stated.

Fabrication of parts from these polymer system includes prepreg, wet fiber wrapping, injection molding and any other method typically exercised to make parts using other resin systems. The preferred fabrication method is selected based upon the properties required for the final material, ease of fabrication desired and the geometry of the product being fabricated. Most cyclic silazanes evolve gases during a portion of their processing, thereby requiring this factor to be included in the process selection and tooling design.

EXAMPLE 1

Methylhydridocyclosilazane was mixed with fused quartz fabric to prepare a composite coupon having a resin content of approximately 45 percent by volume with the remainder being quartz fabric. The initial resin had a viscosity of less than 10 cps and was a mixture of low molecular weight oligomers, thereby making it difficult to polymerize to a high yield. The desired trimmed coupon size was 1×3 inches anci this required a polytetrafluoroethylene (Teflon) processing tool with a groove 125 mils deep and 1.25×3.25 inches in dimensions.

The coupons were prepared by cutting 4 quartz fabric pieces, each being 10 mils thick, to a dimension of 1.25× 3.25 inches. These coupons were stacked in the tool groove with fibers oriented normal to each other in adjacent fabric pieces. The total weight of the fabric pieces was 2.85 grams and to achieve a resin volumetric content of 45 percent required 1.43 grams of resin. The resin was poured on the fabric with emphasis to insure even distribution across the entire surface.

An excess of the resin with catalyst mixture was prepared separately for pouring onto the fabric by mixing 8 grams of methylhydridocyclosilazane with 0.1 grams of tetramethylquinidine followed by stirring. The mix was poured over the fabric in the tool until the appropriate weight was reached. The fabric was tapped repeatedly to work the resin into the fabric. The tool was then covered with a metal or glass plate and placed in a high pressure autoclave. A vacuum of 29.6 mm Hg was then applied and held for 3 miutes in the autoclave chamber to deplete the chamber air and to assist in the removal of air pockets in the fabric. Following the vacuuming, the chamber was pressurized with a dry nitrogen gas environment to a pressure of 250 psi. The resin and fabric were then heated at a rate of 10° C./minute up to a temperature of 135° C. for one hour followed by about a two hour heating period of 150° C. The resin mixture had cured to a polymer of at least 10,000 cps. The prepreg is now removed from the tool and placed in a metal tool of equivalent design which is resistant to high compressive forces and high temperatures.

The metal tool and composite were then subjected to a 29.6 mm Hg. vacuum for two minutes followed by a rapid heating rate of 20° C./minute up to 150° C. As the heating occurs, a compaction force of 1500 psi was applied when the temperature of 120° C. is reached. After a half hour temperature plateau at 150° C., the temperature was elevated in 27° C. increments each half hour urtil a plateau of 345° C. was reached and held for 1 hour. Cooling then occurred with the compaction pressure continuously applied until a cool down temperature of 95° was reached.

At this point, the resin has been cured to an advanced state, but is still laden with methyl groups with potential to become free carbon upon being subjected to any high temperature application or processing step which exceeds 400° C. The composite is now thermally treated at an elevated temperature with an environment of dry ammonia gas. The heating rate of 20° C./minute is initiated until a 350° C. temperature plateau was reached. There is then a 30 minute hold followed by a 10° C./minute elevation to 400° C. and a 30 minute hold. This cycle is repeated for 450° C. and 500° C. However, the 500° C. hold is for 4 hours followed by cooling to room temperature. The resin in the composite is now in a carbon free preceramic state.

EXAMPLE 2

Coupon preparation was the same as in Example 1 except that the resin was filled with particulate fusec silicon dioxide to a 45% by volume content. The net effect is reduction in the resin content ratio, thereby resulting in a reduction from shrinkage. Additionally, the higher silicon dioxide content contributes to improved structural qualities.

After a large batch of resin and catalyst has been mixed as previously described in Example 1, the particulate silicon dioxide is added at a proportion of 1 gram of quartz to 0.55 grams of resin. Silicon dioxide with an average particle size in the 5 to 10 micron range was used. This mixture was ball milled using alumina balls in a dry nitrogen condition for 24 hours at a 40 rpm rate. At this stage, the mixture has become a slurry which is used equivalently as the resin in Example 1.

Though the invention has been described with reference to specific preferred embodiments thereof, many variations and modifications will immediately become apparent to those skilled in the art. It is therefore the intention that the appended claims be interpreted as broadly as possible in view of the prior art to include all such variations and modification.

What is claimed is:

1. A method of making a shaped article containing less than 0.5 percent free carbon by weight which comprises the steps of:

(a) providing a shaped tool;

(b) providing a composite of quartz fibers disposed within a polysilazane which is moldable at a temperature below the curing temperature of the polysilazane;

(c) applying a pressure to said composite to ensure contact of said composite to said tool;

(d) curing the composite; and (e) heating the cured composite at less than about 600° C. in an environment of dry ammonia which expels organic radicals to provide a hardened shaped article containing less than 0.5 percent carbon.

2. The method of claim 1 wherein heating is at a temperature sufficiently low so as to avoid breakdown of said quartz fibers.

3. The method of claim 2 further including the step of adding a filler to said composite at least of one of particles, fibers, whiskers or any geometric shape taken from the class consisting of silicon dioxide, aluminum oxide, boron oxide and yttrium oxide in a finite amount up to 70 percent by weight of said composite.

4. The method of claim 1 further including the step of adding a filler to said composite at least of one of particles, fibers, whiskers or any geometric shape taken from the class consisting of silicon dioxide, aluminum oxide, boron oxide and yttrium oxide in a finite amount up to 70 percent by weight of said composite.

5. The method of claim 1 further comprising converting the hardened shaped article to a ceramic by heating to a temperature sufficiently high in an inert atmosphere for a sufficient time.

6. The method of claim 5 further including the steps of cooling said ceramic, infiltrating said ceramic with polysilazane reacted with urea and then reprocessing said ceramic according to steps (c) and (d).

7. The method of claim 1 wherein said composite further includes a catalyst.

8. The method of claim 7 wherein, when said silicon-based polymer is a polysilazane and the catalyst is tetramethylguanidine.

9. A method of making a shaped article containing less than 0.5 percent free carbon by weight which comprises the steps of:

(a) providing a shaped tool;

(b) providing a composite of quartz fibers disposed within a polysilazane which is moldable at a temperature below the curing temperature of the polysilazane, wherein said composite includes a catalyst;

(c) applying a pressure to said composite to ensure contact of said composite to said tool;

(d) curing the composite; and (e) heating the cured composite at less than about 600° C. in an environment of dry ammonia which expels organic radicals to provide a hardened shaped article containing less than 0.5 percent carbon.

10. The method of claim 9 wherein heating is at a temperature sufficiently low to avoid breakdown of said fibers.

* * * * *

UNITED STATES PATENT AND TRADEMARK OFFICE
CERTIFICATE OF CORRECTION

Patent No.: 6,063,327
Dated: May 16, 2000
Inventor(s): Louis R. Semff It is certified that error appears in the above-identified patent and that said Letters Patent is hereby corrected as shown below:

Col. 1, line 65; after "in", delete "higa" and insert --high--.
Col. 3, line 14; delete "midst" and insert --must--.
Col. 3, line 19; after "the", delete "Precursor" and insert --precursor--.
Col. 3, line 22; after "of", delete "organcsilicon" and insert --organosilicon--.
Col. 3, line 23; after "of", delete "cyclos-lazanes" and insert --cyclosilazanes--.
Col. 3, line 54; after "good", delete "Electrical" and insert --electrical--.
Col. 3, line 62; delete "oxice" and insert --oxide--.
Col. 5, line 11; after "certain", delete "decree" and inset --degree--.
Col. 7, line 19; after "accomplished", delete "bad" insert --by--.
Col. 7, line 25; after "special", delete "ourpose" and insert --purpose--.
Col. 8, line 58; after "inches", delete "anci" and insert --and--.
Col. 9, line 50; after "particulate", delete "fusec" and insert --fused--.

Signed and Sealed this

Tenth Day of April, 2001

*Attest:*

NICHOLAS P. GODICI

*Attesting Officer*   Acting Director of the United States Patent and Trademark Office